United States Patent [19]

Deprez et al.

[11] Patent Number: 5,624,783
[45] Date of Patent: Apr. 29, 1997

[54] IMAGING ELEMENT FOR MAKING A LITHOGRAPHIC PRINTING PLATE

[75] Inventors: Lode Deprez, Wachtebeke; Eric Kiekens, Kessel-Lo, both of Belgium

[73] Assignee: Agfa-Gevaert, N.V., Mortsel, Belgium

[21] Appl. No.: 629,135

[22] Filed: Apr. 8, 1996

[30] Foreign Application Priority Data

Apr. 7, 1995 [EP] European Pat. Off. ............. 95200882

[51] Int. Cl.$^6$ .................. G03C 1/83; G03C 8/52; G03C 8/06; G03F 7/07
[52] U.S. Cl. ................ 430/204; 430/30; 430/227; 430/229; 430/248; 430/221; 430/264; 430/398; 430/432; 430/454; 430/517; 430/520; 430/522
[58] Field of Search ............ 430/204, 227, 430/229, 248, 221, 398, 432, 454, 517, 520, 522, 30, 264

[56] References Cited

U.S. PATENT DOCUMENTS

| | | | |
|---|---|---|---|
| 5,264,322 | 11/1993 | Carlier et al. | 430/221 |
| 5,468,588 | 11/1995 | Macioch et al. | 430/204 |
| 5,536,817 | 7/1996 | Michiels et al. | 430/204 |

*Primary Examiner*—Richard L Schilling
*Attorney, Agent, or Firm*—Breiner & Breiner

[57] ABSTRACT

The present invention provides an imaging element comprising on one side of a support a photosensitive layer comprising a silver halide emulsion and an image receiving layer containing physical development nuclei in water permeable relationship with said emulsion layer and on the other side of the support at least one backing layer comprising gelatin and a dye and/or a dye precursor characterized in that said dye or dye precursor is such that after treatment of said imaging element in an alkaline solution with a pH of 10.9 for 20 s at a temperature of 30° C. the backing layer has a reflection spectrum when treated for 20 s at 20° C. in a neutralizing solution with a pH of 7.5 that is visually different from the reflection spectrum when treated for 20 s at 20° C. in a neutralizing solution with a pH of 8.5.

9 Claims, No Drawings

IMAGING ELEMENT FOR MAKING A LITHOGRAPHIC PRINTING PLATE

FIELD OF THE INVENTION

The present invention relates to an imaging element for making a lithographic printing plate according to the silver salt diffusion transfer process and more in particular to an imaging material that will yield printing plates having improved lithographic printing properties such as an improved ink acceptance.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André & Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable, especially for low printing runs, that the number of copies that have to be disposed of because of poor ink acceptance in the printing areas and/or ink acceptance in the non-printing areas during start-up of the printing process is limited.

In the preparation of these plates the exposure and developing step of the imaging element is in most cases followed by a neutralization step. This step is very important for the number of copies that have to be disposed of because of poor ink acceptance in the printing areas during start-up of the printing process. When the pH of the neutralization liquid is to high (i.e. higher than 8) the resulting printing plate has a (very) bad ink acceptance. It is thus very important that the neutralization liquid is refreshed in time in order to keep the pH of the neutralization liquid low enough.

This is especially important for printing plates made in a camera platemaker. This is an integrated apparatus wherein the exposure and the processing of the photosensitive material is executed in one apparatus and control of the neutralization liquid will require the stop of the total process of plate making. Furthermore, in many cases plates made in such a camera platemaker are used for printing a few days after their preparation while still new plates are made in said camera platemaker. If then is discovered that the ink acceptance of a plate is bad due to an exhausted neutralization liquid, the plates made in the mean time will also have a bad ink acceptance, requiring for all these plates an extra treatment with a starter to get a printing plate with a good ink acceptance. This is an ecological uninteresting, time consuming and thus costly processus, that is even not possible for plates with great dimensions.

In JP Pi 06-301216 a method for detecting the degree of exhaustion of a treating solution for a lithographic plate by incorporating an acid/base indicator in the solution is described. This solution has however serious drawbacks in that visual inspection of said liquid requires stopping of the camera platemaker and thus loss of production capacity and is in many instances practically impossible due to discoloration of the neutralization solution and the presence of sludge therein.

SUMMARY OF THE INVENTION

It is an object of the present invention to provide an imaging element for detecting the degree of exhaustion of a neutralization liquid used in the preparation of a lithographic plate from a photosensitive material according to the DTR-process.

It is a further object of the present invention to provide a method for making a lithographic printing plate according to the DTR-process having good printing properties i.e. good ink acceptance in the printing areas, no ink acceptance in the non-printing areas and a low number of copies that have to be disposed of because of poor ink acceptance in the printing areas and/or ink acceptance in the non-printing areas during start-up of the printing process.

Further objects of the present invention will become clear from the description hereinafter.

According to the present invention there is provided an imaging element comprising on one side of a support a photosensitive layer comprising a silver halide emulsion and an image receiving layer containing physical development nuclei in water permeable relationship with said emulsion layer and on the other side of the support at least one backing layer comprising gelatin and a dye and/or a dye precursor characterized in that said dye or dye precursor is such that said backing layer after treatment of said imaging element in an alkaline solution with a pH of 10.9 for 20 s at a temperature of 30° C. the backing layer has a reflection spectrum when treated for 20 s at 20° C. in a neutralizing solution with a pH of 7.5 that is visually different from the reflection spectrum when treated for 20 s at 20° C. in a neutralizing solution with a pH of 8.5.

According to the present invention there is provided a method for making a lithographic printing plate according to the silver salt diffusion transfer process comprising the steps of:

image-wise exposing an imaging element as described above;

developing said imaging element in the presence of developing agent(s) and silver halide solvent(s) using an alkaline processing solution and treating the thus obtained developed imaging element using a neutralizing solution having a pH at 20° C. between 5 and 8.

DETAILED DESCRIPTION OF THE INVENTION

It has been found that with an imaging element as described above a very easy method for detecting the degree of exhaustion of a neutralization liquid used in the preparation of a lithographic plate from a photosensitive material according to the DTR-process is provided. Indeed there is a visual difference in reflection spectrum between a plate obtained by neutralizing an exposed and developed imaging element in a neutralization liquid having a pH of at most 7.5 (a still effective neutralizer) and a plate obtained by neutralizing an exposed and developed imaging element in a neutralization liquid having a pH of at least 8.5 (an exhausted neutralizer).

One can even perfectly visualize a system wherein the last compartment of such a camera platemaker comprises a reflection densitometer which measures the reflection spectrum of a processed plate and gives a signal as soon as the processed plate's reflection spectrum is not longer in accordance with the prescribed reflection spectrum obtained by processing in a neutralization liquid with a pH of 7.5.

A visual difference in reflection spectra means a displacement ever at least 20 nm in the wavelength of the minimum or maximum of said spectra or an increase or decrease with at least 10%, more preferably with at least 20% of the absorption coefficient at the wavelength of the maximum or minimum of said spectra in the range between 400 and 700 nm.

Said alkaline solution is preferably a solution in water of 10.6 g/l sodium carbonate, 8.4 g/l sodium hydrogen carbonate and 60 ml/l 2-aminoethyl-aminoethanol. Said solution may further comprise other ingredients which may be present in an activating solution as described hereinafter. Said solution should comprise no dye or dye precursor.

Said neutralizing solution with at 20° C. a pH of 7.5 contains 10 g/l of triethanolamine, 40 g/l of $NaH_2PO_4.H_2O$ and sodium hydroxide to obtain the desired pH. The neutralizing solution with at 20° C. a pH of 8.5 contains 10 g/l of triethanolamine, 40 g/l of $NaH_2PO_4.H_2O$ and sodium hydroxide to obtain the desired pH.

The amount of dye or dye precursor in said backing layer is i.a. dependant on the structure of said dye or dye precursor but is preferably between 5 and 1000 mg/m², more preferably between 10 and 500 mg/m², most preferably between 15 and 300 mg/m².

Dyes suitable for use in accordance with the present invention belong to a class selected from the group consisting of e.g. oxazines, monomethin pyrazolone-oxonoles and p-amino-triphenyl methanes. An example of such dyes is a dye corresponding to the following formula.

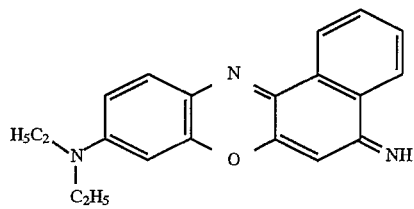

Dye 1

The imaging element in connection with the present invention essentially comprises on one side of a support a photosensitive layer comprising a silver halide emulsion and an image receiving layer containing physical development nuclei in water permeable relationship with said emulsion layer and on the other side of the support at least one backing layer comprising gelatin and a dye or a dye precursor Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene later which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966).

According to the present invention the emulsion or emulsions preferably consist principally or totally of silver chloride while a fraction of silver bromide may be present ranging from 1 mole % to 40 mole %. When the fraction of silver bromide is 5% or more, the emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photothem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat. Nos. 2,592,250, 3,206,313, 3,271, 157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050, formaldehyde, hydrazine, hydroxylamine, sulphur compounds e.g. thiourea dioxide, phosphonium salts e.g. tetra(hydroxymethyl)-phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. No. 2,095,856, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual stabilizers. Suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 092,168, U.S. Pat. No. 4,311,787 and DE-P 2,453,217.

More details about the composition, preparation and coating of silver halide emulsions can be found in e.g. Product Licensing Index, Vol. 92, December 1971, publication 9232, p. 107–109.

The layer containing physical development nuclei can be free of hydrophilic binder but preferably comprises amounts upto 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an antihalation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2–10 μm and more preferably between 2 μm and 5 μm. The matting agents are generally used in a total amount in the imaging element of 0.1 $g/m^2$ to 2.5 $g/m^2$. At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In an imaging element in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack. When the backing layer consists of a double layer packet, the layer comprising gelatin and a dye and/or a dye precursor may be any of the two layers but is preferably the outerlying layer of said packet.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g., 2,4-dichloro-6-hydroxy-s-triazine, triacrylformal and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy (meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth)acrylates, and styrene sulphonic acids.

The above described DTR mono-sheet imaging element in connection with the present invention is exposed in an apparatus according to its particular application, e.g. a conventional process camera containing a conventional light source or a high intensity short time exposure such as e.g. a laser containing device. Subsequently the imaged element is developed with an alkaline processing liquid in the presence of developing agent(s) and silver halide solvent(s).

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrrolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used. Said developing agents may be contained in an alkaline processing liquid but are preferably contained in one or more layers of the photographic element. In the latter case the alkaline processing liquid merely serves as an alkaline activating liquid.

The pH of said alkaline liquid is preferably between 9 and 14, more preferably between 10 and 14 and may be established by an organic and/or inorganic alkali agent. Examples of suitable alkali agents are e.g. sodium hydroxide, carbonates, phosphates, alkanolamines or mixtures thereof.

The alkaline processing liquid preferably also contains a preserving agent having antioxidation activity, e.g. sulphite ions. Further may be present a thickening agent, fog inhibiting agents e.g. a benzotriazole which is known to improve the printing endurance, calcium-sequestering compounds, anti-sludge agents, development accelerators and hardeners including latent hardeners.

Suitable silver complexing agents also called silver halide solvents for use in accordance with the present invention are e.g. thiosulphate or thiocyanate in an amount ranging from 5 g to 20 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers, preferably di- or poly-thioethers as disclosed in e.g. U.S. Pat. No. 4,960,683 and EP-A 554,585.

Still further suitable silver halide solvents are meso-ionic compounds, preferably 1,2,4-triazolium-3-thiolates as disclosed in e.g. EP-A 554,585.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

The development step is preferably followed by a neutralization of the surface of the imaged element by guiding the element through a neutralization liquid having a pH between 4 and 8. The pH of a fresh neutralizing solution lies preferably between 5 and 7. The neutralization liquid preferably contains a buffer e.g. a phosphate buffer, a citrate buffer, an amine or a mixture thereof. The neutralization solution can further contain bactericides, e.g. phenol, thymol or 5-bromo-5-nitro-1,3-dioxan as described in EP-150,517, wetting agents e.g. saponins or pluronics etc. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

To improve the differentiation between the hydrophobic silver image and the hydrophilic background the alkaline processing liquid and/or neutralization liquid preferably contain one or more hydrophobizing agents. Generally these compounds contain a mercapto group or thiolate group and one or more hydrophobic substituents, e.g. those described in U.S. Pat. No. 3,776,728 and U.S. Pat. No. 4,563,410. Preferred hydrophobizing agents are 2-mercapto-1,3,4-thiadiazoles as described in DE-A 1,228,927 and in U.S. Pat. No. 4,563,410, 2-mercapto-5-alkyl-1,3,4-oxadiazoles, 3-mercapto-5-alkyl-1,2,4-triazoles and long chain (at least 5 carbon atoms) alkyl substituted mercaptotetrazoles. Particularly preferred compounds are 2-mercapto-5-n-heptyl-1,3,4-oxadiazole and 3-mercapto-4-acetamido-5-n-heptylalkyl-1,2,4-diazoles A lithographic printing plate is thus obtained.

The invention will now be illustrated by the following example without however the intention to limit the invention thereto. All parts are by weight unless otherwise specified.

EXAMPLE

Preparation of the silver halide emulsion coating solution.

A silver chloroiodide emulsion composed of 99.7 mole % of chloride and 0.3 mole % of iodide was prepared by the double jet precipitation method. The average silver halide grain size was 0.38 μm (diameter of a sphere with equivalent volume) and contained Rhodium ions as internal dopant. The emulsion was orthochromatically sensitized and stabilized by a 1-phenyl-5-mercapto-tetrazole.

A base layer coating solution was prepared having the following composition:

| | |
|---|---|
| gelatin | 5.5% |
| carbon black | 0.76% |
| silica particles (5 μm) | 1.6% |

Preparation of the imaging element I:

The emulsion coating solution and base layer coating solution were simultaneously coated by means of the slide-hopper coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 $g/m^2$ and the gelatin content was 1.5 $g/m^2$. The emulsion layer further contained 0.15 $g/m^2$ of 1-phenyl-4,4'-dimethyl-3-pyrazolidone and 0.25 $g/m^2$ of hydroquinone. The base layer was coated such that the amount of gelatin in the coated layer was 3 $g/m^2$.

The layer nearest to the support of the backing layer pack contained 0.3 $g/m^2$ of gelatin and 0.5 $g/m^2$ of the antistatic agent co(tetraallyloxyethane/methacrylate/acrylic acid-K-salt) polymer. The second backing layer contained 4 $g/m^2$ of gelatin, 0.15 $g/m^2$ of a matting agent consisting of transparent spherical polymeric beads of 3 micron average diameter according to EP-A 80225, 0.05 $g/m^2$ of hardening agent triacrylformal, 0.030 $g/m^2$ of dye 1 and 0.021 $g/m^2$ of wetting agent $F_{15}C_7$—$COONH_4$.

The thus obtained element was dried and subjected to a temperature of 40° C. for 5 days and then the emulsion layer was overcoated with a layer containing PdS as physical development nuclei, hydroquinone at 0.4 $g/m^2$ and formaldehyde at 100 $mg/m^2$.

The thus obtained element was dried and again subjected to a temperature of 40° C. for 5 days. The following processing solutions were prepared:

| Activator | |
|---|---|
| sodium carbonate (g) | 10.6 |
| sodium hydrogen carbonate (g) | 8.4 |
| sodium sulphite anh. (g) | 35 |
| 1-methyl-4-allyl-1,2,4-triazolium-3-thiolate (mg) | 1000 |
| 2-aminoethyl-aminoethanol (ml) | 60 |
| 3-mercapto-4-acetamido-5-n.heptyl-1,2,4-triazole (mg) | 150 |
| water to make | 1 l |
| pH | 10.9 |

| Neutralization solutions | K | L |
|---|---|---|
| Triethanolamine (g) | 10 | 10 |
| $NaH_2PO_4.2H_2O$ (g) | 40 | 40 |
| sodium hydroxyde to make pH | 7.5 | 8.5 |
| water to make | 1 l | 1 l |

| Dampening solution | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

Two imaging elements I were each image-wise exposed, processed with the above described activator for 20 s at 30° C. and subsequently neutralized for 20 s at 20° C. with one of the neutralization solutions K or L and dried.

The obtained plates were visually clearly different, the first plate has an absorption at 460 nm=0.35, while the second plate has an absorption at 460 nm=0.40.

The printing plates thus prepared were mounted on the same offset printing machine (A B Dick 9860) and were used for printing under identical conditions. The above mentioned dampening solution was used at a 5% concentration in an aqueous solution containing 15% isopropanol as fountain solution. The ink used was A B Dick 1020. A compressible rubber blanket was used.

The plates, were evaluated for the number of copies that had to be disposed of at the start of the printing process because of poor quality, mainly non-ink acceptance in the printing areas. It was found that the number of useless copies in case the neutralizing solution K was used, was 15 whereas in case the neutralizing solution L was used the ink acceptance in the printing area was more than 50 before a good copy was obtained.

We claim:

1. An imaging element comprising on one side of a support a photosensitive layer comprising a silver halide emulsion and an image receiving layer containing physical development nuclei in water permeable relationship with said emulsion layer and on the other side of the support at least one backing layer comprising gelatin and a dye and/or a dye precursor characterized in that said dye or dye precursor is such that after treatment of said imaging element in an alkaline solution with a pH of 10.9 for 20 s at a temperature of 30° C. the backing layer has a reflection spectrum when treated for 20 s at 20° C. in a neutralizing solution with a pH of 7.5 that is visually different from the reflection spectrum when treated for 20 s at 20° C. in a neutralizing solution with a pH of 8.5.

2. An imaging element according to claim 1 wherein said dye belongs to a class selected from the group consisting of oxazines, monomethin pyrazolone-oxonoles and p-aminotriphenyl methanes.

3. An imaging element according to claim 2 wherein said dye is a dye corresponding to the following formula.

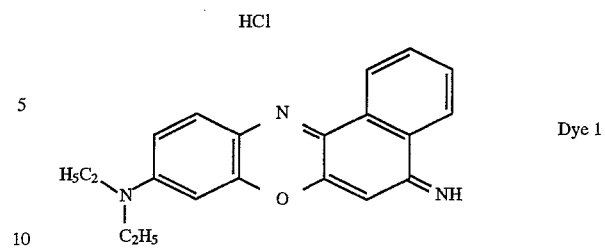

Dye 1

4. An imaging element according to claim 1 wherein in said backing layer said dye is present in an amount between 5 and 1000 mg/m².

5. An imaging element according to claim 1 wherein in said backing layer said dye is present in an amount between 15 and 300 mg/m².

6. An imaging element according to claim 1 wherein said visual difference in reflection spectra is a displacement over at least 20 nm in the wavelength of the minimum or maximum of said spectra in the range between 400 and 700 nm.

7. An imaging element according to claim 1 wherein said visual difference in reflection spectra is an increase or decrease with at least 10% of the absorption coefficient at the wavelength of the maximum or minimum of said spectra in the range between 400 and 700 nm.

8. A method for making a lithographic printing plate according to the silver salt diffusion transfer process comprising the steps of:
   image-wise exposing an imaging element according to claim 1;
   developing said imaging element in the presence of developing agent(s) and silver halide solvent(s) using an alkaline processing solution and
   treating the thus obtained developed imaging element using a neutralizing solution having a pH at 25° C. between 5 and 8.

9. A method according to claim 8 wherein the pH of a fresh neutralization solution lies between 5 and 7.

* * * * *